(12) United States Patent
Adamski

(10) Patent No.: US 8,624,335 B2
(45) Date of Patent: Jan. 7, 2014

(54) ELECTRONIC MODULE METALIZATION SYSTEM, APPARATUS, AND METHODS OF FORMING SAME

(75) Inventor: Jaroslaw Adamski, Streamwood, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 111 days.

(21) Appl. No.: 13/247,913

(22) Filed: Sep. 28, 2011

(65) Prior Publication Data

US 2012/0273849 A1    Nov. 1, 2012

Related U.S. Application Data

(60) Provisional application No. 61/481,160, filed on Apr. 30, 2011.

(51) Int. Cl.
*H01L 27/088*  (2006.01)

(52) U.S. Cl.
USPC ............................................ 257/401; 257/775

(58) Field of Classification Search
USPC .......................................... 257/401, 775, 767
See application file for complete search history.

(56) References Cited

U.S. PATENT DOCUMENTS

| | | | |
|---|---|---|---|
| H842 H * | 11/1990 | Ochs | ............................ 257/767 |
| 6,815,740 B2 | 11/2004 | Nelson et al. | |
| 7,166,867 B2 | 1/2007 | Beach et al. | |
| 2005/0139891 A1 | 6/2005 | Beach et al. | |

* cited by examiner

*Primary Examiner* — Mark Prenty
(74) *Attorney, Agent, or Firm* — Jaquez & Associates; Martin J. Jaquez, Esq.; Merle Richman, Esq.

(57) ABSTRACT

Embodiments of electronic module metallization systems and apparatus and methods for forming same are described generally herein. Other embodiments may be described and claimed.

22 Claims, 9 Drawing Sheets

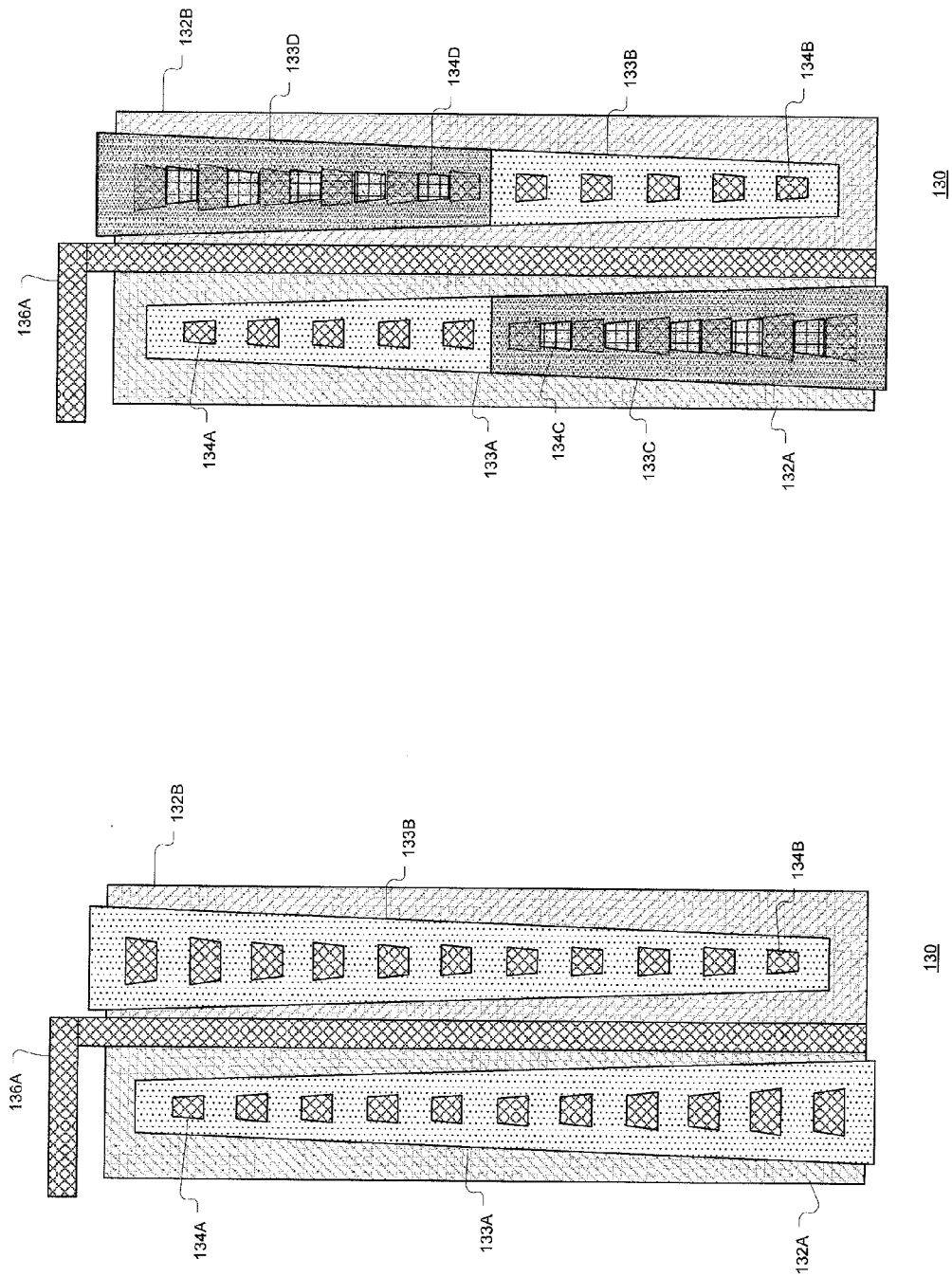

US 8,624,335 B2

ELECTRONIC MODULE METALIZATION SYSTEM, APPARATUS, AND METHODS OF FORMING SAME

The present application claims the benefit of priority under 35 U.S.C. §119 (e) of U.S. Provisional Application No. 61/481,160, filed Apr. 30, 2011, entitled "Electronic Module Metalization System, Apparatus, and Methods of Forming Same"; and the disclosure of U.S. Provisional Application No. 61/481,160 is hereby incorporated by reference herein as if set forth in full.

TECHNICAL FIELD

Various embodiments described herein relate generally to electronic modules metallization systems and apparatus and methods for forming same.

BACKGROUND

It may be desirable to limit the long term effect of electromigration and reduce the parasitic capacitance of electronic modules. The present invention provides a system, method, and apparatus for same.

BRIEF DESCRIPTION OF THE DRAWINGS

FIG. 7A is a block diagram of a semiconductor circuit or module with a first metallization, finger, or electrode pattern according to various embodiments.

FIG. 7B is a block diagram of a semiconductor circuit or module with a first metallization, finger, or electrode pattern and additional metallization, finger, or electrode pattern according to various embodiments.

DETAILED DESCRIPTION

Figure 1:
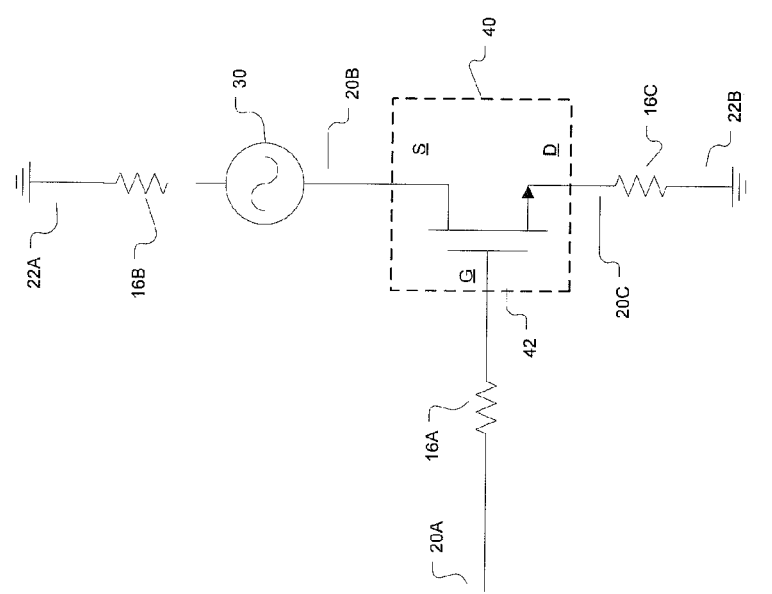
FIG. 1 is a block diagram of a signal processing system according to various embodiments.

FIG. 1 is a block diagram of a signal processing system 10 according to various embodiments. As shown in FIG. 1, the system 10 includes resistors 16A, 16B, and 16C, a frequency signal generator module 30, and a controllable module 40. The frequency signal generator module 30 may generate signals 20B including various frequencies from audio to radio frequency (RF). A control or bias signal 20A may be coupled to the controllable module 40 via the resistor 16A. The controllable module 40 may process the signal 20B based on the signal 20A. The module 40 processed signal 20C may be read across resistor 16C.

Figure 2A:
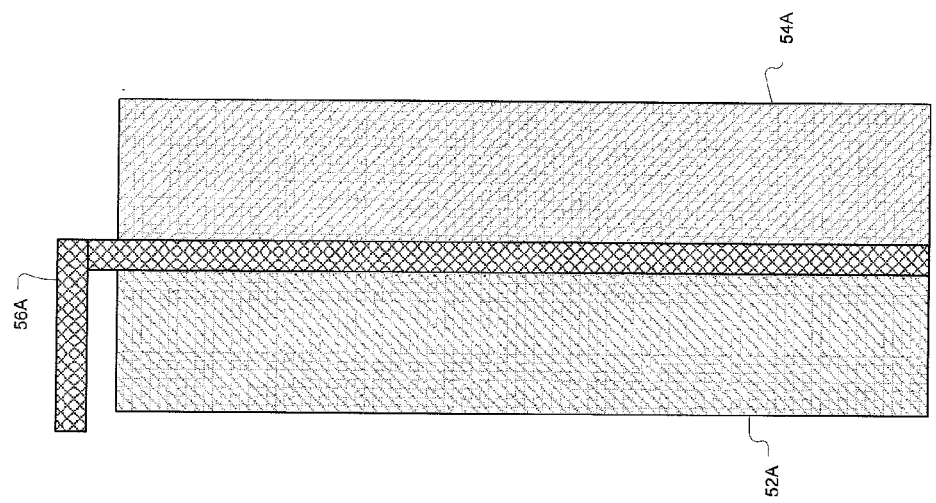
FIG. 2A is a block diagram of a semiconductor circuit or module according to various embodiments.

In an embodiment, the controllable module 40 may include one or more controllable elements or modules such as an n-type complementary metal-oxide-semiconductor N-CMOS transistor 42 or other electronic modules including a semiconductor transistor 42. FIG. 2A is a block diagram of a semiconductor circuit or module 50 according to various embodiments. In an embodiment the module 50 may be any electronic circuit including a semiconductor. The module 50 may be a transistor such as an NMOS or a PMOS transistor.

In an embodiment the transistor or module 50 may include a first submodule, cell, or channel 52A, a third submodule, cell, or channel 56A, and a second submodule, cell, or channel 54A. In a NMOS transistor the first submodule may represent a source channel or cell 52A and may include a p-type silicon well in a silicon substrate, an n-type silicon channel, and a top insulator such as silicon dioxide. The second submodule may represent a drain channel or cell 54A and may include an n-type silicon channel in the p-type silicon well in the silicon substrate and a top insulator such as silicon dioxide. The third submodule may represent a gate channel or cell 56A and may include an n-channel in the p-type silicon well in the silicon substrate, a top insulator, and a metal track (metallization), finger, or electrode electrically coupled to the third submodule or gate channel or cell.

Similarly in a PMOS transistor the first submodule may represent a source channel or cell 52A and may include an n-type silicon well in a silicon substrate, a p-type silicon channel, and a top insulator such as silicon dioxide. The second submodule may represent a drain channel or cell 54A and may include a p-type silicon channel in the n-type silicon well in the silicon substrate and a top insulator such as silicon dioxide. The third submodule may represent a gate channel or cell 56A and may include a p-channel in the n-type silicon well in the silicon substrate, a top insulator, and a metal track (metallization), electrode, or finger electrically coupled to the third submodule or gate channel or cell. The transistor or module 50 is shown from a top level. Other semiconductor configurations may be employed according to the present invention.

In a transistor or module 50, a metal track or metallization may be applied to a channel or cell 52A, 56A, 54A to provide an electrically conducting coupling or electrode for the transistor segment, channel or cell such as the n-type or p-type channel (for NMOS or PMOS, respectively). Similarly, another metal track, metallization or finger may be applied to another transistor segment, channel or cell 52A, 54A, 56A such as the n-type or p-type channel (for NMOS or PMOS, respectively) to form an electrode for the channel or cell. In an embodiment the channel, cell, or section 54A may represent a second submodule, channel, or cell (drain in an embodiment) and the channel, cell, or section 52A may represent a first submodule, channel, or cell (source in an embodiment) for a MOS transistor or module 50.

Figure 2C:
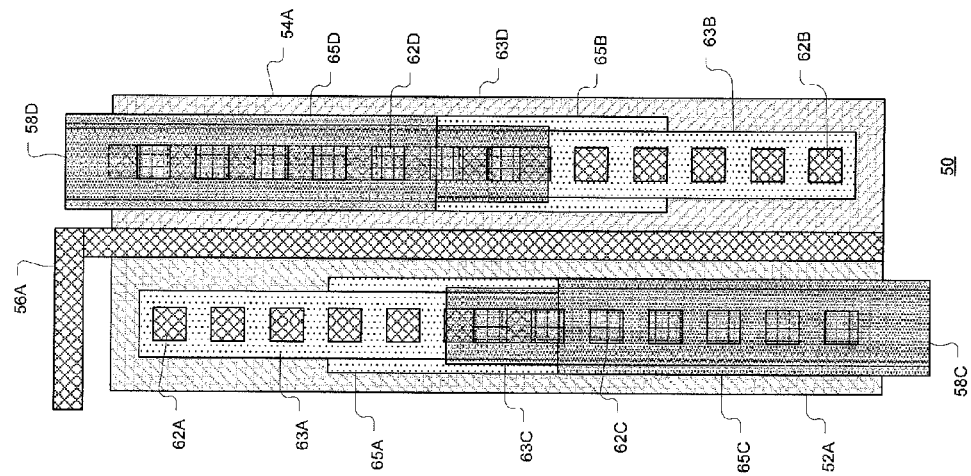
FIG. 2C is a block diagram of a semiconductor circuit or module with a first metallization, finger, or electrode pattern and additional metallization, finger, or electrode pattern according to various embodiments.
Figure 2B:
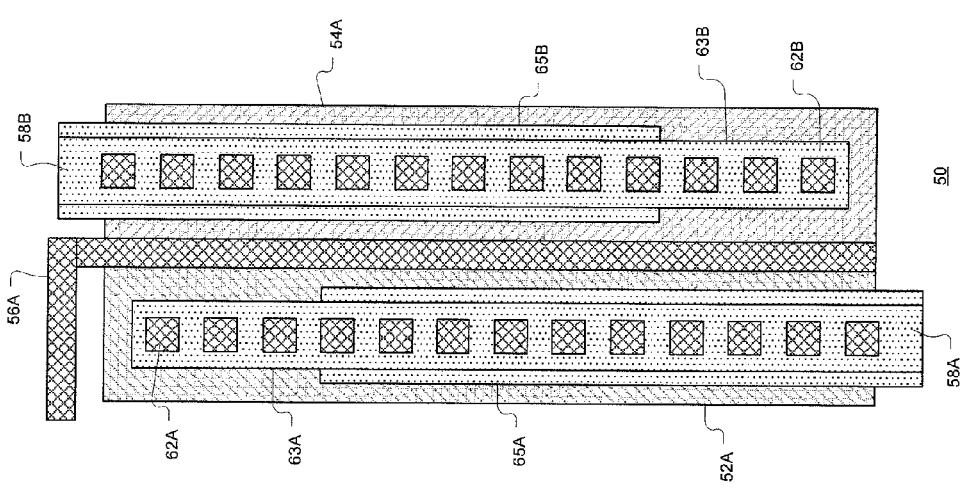
FIG. 2B is a block diagram of a semiconductor circuit or module with a first metallization, finger, or electrode pattern according to various embodiments.

Electromigration in the submodules 52A, 54A, 56A (source, drain, and gate in an embodiment) in the respective metallizations, fingers or metal tracks (58A, 58B, and 56A in FIG. 2B for example) may affect the resistance or conductance of the submodules 52A, 54A, 56A. The submodules 52A, 54A, 56A (source, drain, and gate in an embodiment) respective metallizations, fingers or metal tracks (58A, 58B, an 56A in FIG. 2B for example) configuration or geometry may create parasitic capacitances in the respective transistor or module 50. FIG. 2B is a block diagram of the semiconductor transistor or module 50 with a metallization, fingers, or tracks 58A, 58B for the first submodule, channel, cell (or source) 52A and the second submodule, channel, cell (or drain 54A) according to various embodiments. As shown in FIG. 2B metallization, finger, electrode, or track 58A may include a wide, proximal narrow, distal section 65A and a narrower, distal section 63A of metal or alloy applied to the channel or cell 52A. The metallization, finger, or track 58A may be comprised of any conducting metal or alloy including aluminum.

The first submodule, channel, or cell 52A (source in an embodiment) metallization, finger, electrode, or track 58A may include a plurality of contact pads 62A coupling the metallization, finger, or track 58A, sections 63A, 65A to the first submodule, channel, cell 52A or source in an embodiment semiconductor channel (n-type or p-type) or other section, segment, or layer. The metallization 58A sections 63A, 65A may be contiguous metal or alloy. In an embodiment, the electrical current at the metallization, track, or finger's 58A wide, proximal section 65A may be greater at its base and lower at its distal section 63A. The wider proximal section 65A of the finger or track 58A may reduce the effect of electromigration in an embodiment.

The second submodule, channel, cell (or drain) 58B metallization, finger, electrode, or track metallization, finger, electrode, or track 58B may also include two sections: a distal narrow, section 63B and a wide proximal section 65B with a plurality of contact pads 62B. In an embodiment the electrical current at the metallization, track, or finger's 58B wide, proximal section 65B may be greater at its base and lower at its distal section 63B. The wider proximal section 65B of the finger or track 58B may reduce the effect of electromigration in an embodiment. Further the parasitic capacitance of the module 50 may be reduced due to the narrow, distal sections 63A, 63B of the tracks or fingers 58A, 58B of the channels or submodules 52A, 54A being adjacent the wider sections 65A, 65B of the channels or fingers 58A, 58B, i.e., the respective geometries of the fingers or channels 58A, 58B where the higher electrical currents of the respective channels 58A, 58B are at opposite ends from each other. In an embodiment the tracks, or metallizations or electrodes 58A, 58B may extend substantially along the length of their respective submodule 52A, 54A semiconductor material. In the transistor or module 50 the first submodule, channel, or cell 52A (source) metallization, finger, electrode, or track 58A may be configured to be coupled to a circuit at an end opposite where the second submodule, channel, or cell 54A (drain) metallization, finger, electrode, or track 58B is coupled to a circuit. In an embodiment, the metallizations, electrodes or tracks 58A, 58B are wider 65A, 65B at their respective bases or proximal to the circuit coupling sections and may become narrower 63A, 63B at their distal sections.

Accordingly in an embodiment, the first submodule, channel, or cell 52A (source) metallization, electrode, or track 58A distal end 63A may have greater physical separation from the more active (electrically when operating) second submodule, channel, or cell 54A (drain) metallization, track, or electrode's 58B proximal section 65B. Similarly, the second submodule, channel, or cell 54A (drain) metallization, electrode, or track's 58B distal end 63B metallization, track, or electrode may also have greater physical separation from the more active (electrically when operating) first submodule, channel, or cell 52A (source) metallization, track, or electrode's 58A proximal section 65A.

As noted the metallizations, tracks, fingers, or electrodes 58A, 58B pattern or geometry may help reduce parasitic capacitance of the respective transistor or module 50 formed by the submodules, channels, or cells 52A, 54A, 56A (source, drain, gate in an embodiment). FIG. 2C is a block diagram of the semiconductor transistor or module 50 with a first metallization, finger, electrode, or track 58A, 58B and a second, additional metallization, track, or electrode 58C, 58D formed over the first metallizations, fingers, electrodes, or tracks 58A, 58B (of the submodules, channels, or cells 52A, 54A according to various embodiments.

As shown in FIG. 2C the first submodule, channel, or cell 52A (source in an embodiment) may include a first metallization, finger, electrode, or track 58A and an additional, overlaid metallization, finger, electrode, or track 58C and the second submodule, channel, or cell 54A (drain in an embodiment) may include a first metallization, finger, electrode, or track 58B and an additional, overlaid metallization, finger, electrode, or track 58D. Similar to the first or lower metallizations, fingers, electrodes, or tracks 58A, 58B, the additional, upper metallization, finger, electrode, or track 58C, 58D may include a narrow, distal section 63C, 63D and wide, proximal section 65C, 65D of metal or alloy. The additional, upper metallizations, fingers, electrodes, or tracks 58C, 58D may be comprised of any conducting metal or alloy including aluminum where the metallizations, fingers, electrodes, or tracks 58C, 58D overlay the first metallizations, fingers, electrodes, or tracks 58A, 58B, respectively, submodule, channel, or cell (source in an embodiment) The first submodule, channel, or cell 52A (source in an embodiment) additional, upper metallization, finger, electrode, or track 58C may also include a plurality of contact pads or vias 62C coupling the additional, upper metallization, finger, electrode, or track 58C, sections 63C, 65C to the first submodule, channel, or cell 52A (source in an embodiment) semiconductor channels (n-type or p-type) or other layer. The metallization, finger, electrode, or track 58C sections 63C, 65C may be contiguous metal or alloy. The second submodule, channel, or cell (drain in an embodiment) 58B additional metallization, finger, electrode, or track 58D may also include two sections: an extended narrow, distal section 63D and a wide, proximal section 65D with a plurality of contact pads or vias 62D.

In metallizations, fingers, electrodes, or tracks 58C, 58D the metallization, finger, electrode, or track 58C, 58D extends along a shorter length of the respective first submodule, channel, or cell (source in an embodiment) 52A or second submodule, channel, or cell (drain in an embodiment) 54A semiconductor material than the first metallization, finger, electrode, or track 58A, 58B. In an embodiment the second metallization, finger, electrode, or track 58C, 58D wide, proximal section 65C, 65D may be wider than the first metallization, finger, electrode, or track 58A, 58B wide, proximal section 65A, 65B.

Similarly, the second metallization, finger, electrode, or track 58C, 58D narrow, distal section 63C, 63D may be wider than the first metallization, finger, electrode, or track 58A, 58B narrow, distal section 63A, 63B. The combination of the first and second metallizations, fingers, electrodes, or tracks 58A, 58C for first submodule, channel, or cell 52A (source in an embodiment) may have greater physical separation from the second submodule, channel, or cell (drain in an embodiment) 54A metallization, finger, electrode, or track 58B, 58D proximal sections 65B, 65D. Similarly, the combination of the first and second metallizations, fingers, electrodes, or tracks 58B, 58D for the second submodule, channel, or cell 54A (drain in an embodiment) may have greater physical separation from the first submodule, channel, or cell (source in an embodiment) 52A metallizations, fingers, electrodes, or tracks 58A, 58C proximal sections 65A, 65C.

Figure 2D:
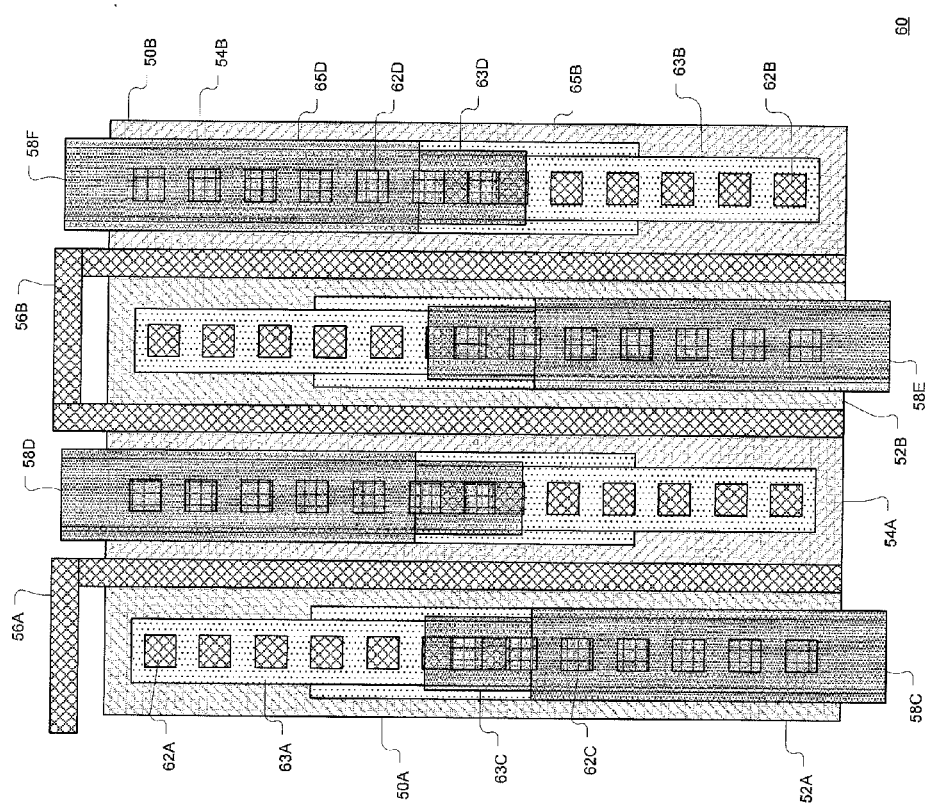
FIG. 2D is a block diagram of a semiconductor circuit with multiple cells or channels with a first metallization, finger, or electrode pattern and additional metallization, finger, or electrode pattern according to various embodiments.

The combined metallizations 58A and 58C, 58B and 58D patterns or geometry may help reduce the effects of electromigration in the metallizations 58A to 58D. The metallizations 58A and 58C, 58B and 58D patterns or geometry may also reduce the parasitic capacitance of the respective transistor or module 50 formed by the first submodule, channel, or cell (source in an embodiment) 52A, the second submodule, channel, or cell (drain in an embodiment) MA, and the third submodule, channel, or cell (gate in an embodiment) 56A. FIG. 2D is a block diagram of a semiconductor circuit 60 with multiple modules 50A, 50B with a first metallization pattern 58A, 58B and an additional metallization pattern 58C, 58D, 58E, 58F according to various embodiments. In an embodiment the circuit 60 may be a CMOS transistor comprised of two modules 50A, 50B. Modules 50A, 50B are similar to the module 50 shown in FIGS. 2A-2C but are coupled together by the common third submodule, cell, or channel (gate in an embodiment) 56B.

The module 50B first submodule, channel, or cell (source in an embodiment) 52B metallizations, fingers, or electrodes 58E are physically further from both the adjacent second submodule, channel, or cell (drain in an embodiment) 54B metallizations, fingers, or electrodes 58F (narrow, distal section 63B) and the module 50A second submodule, channel, or cell (drain in an embodiment) 54A metallizations, fingers, or electrode 58B, 58D narrow section. In an embodiment the effect of electromigration of the metallizations, fingers, electrodes, or tracks 58A, 58B, 58C, 58D, 58E, and 58F may be reduced due to larger combined metallization cross-sectional areas. Parasitic capacitance for the CMOS transistor 60 may also be reduced due to the geometry of the metallizations, fingers, or electrodes 58A, 58B, 58C, 58D, 58E, and 58F.

Figure 3B:
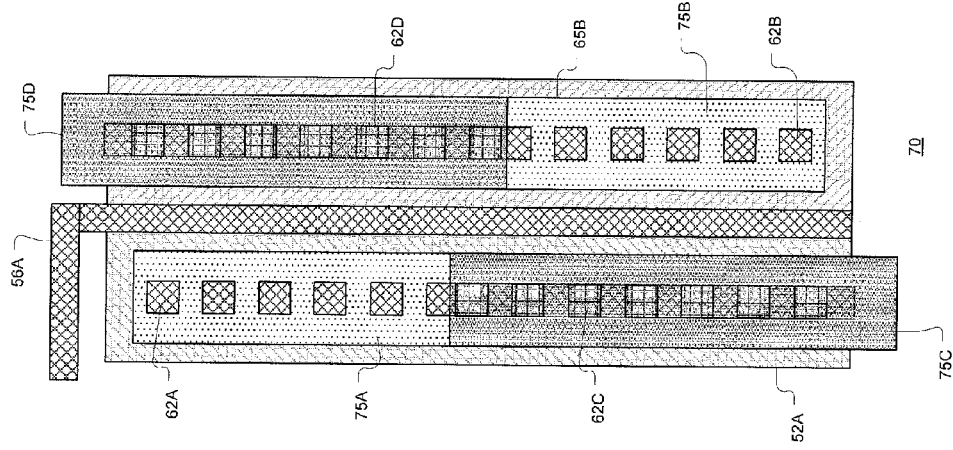
FIG. 3B is a block diagram of a semiconductor circuit or module with a first metallization, finger, or electrode pattern and additional metallization, finger, or electrode pattern according to various embodiments.
Figure 3A:
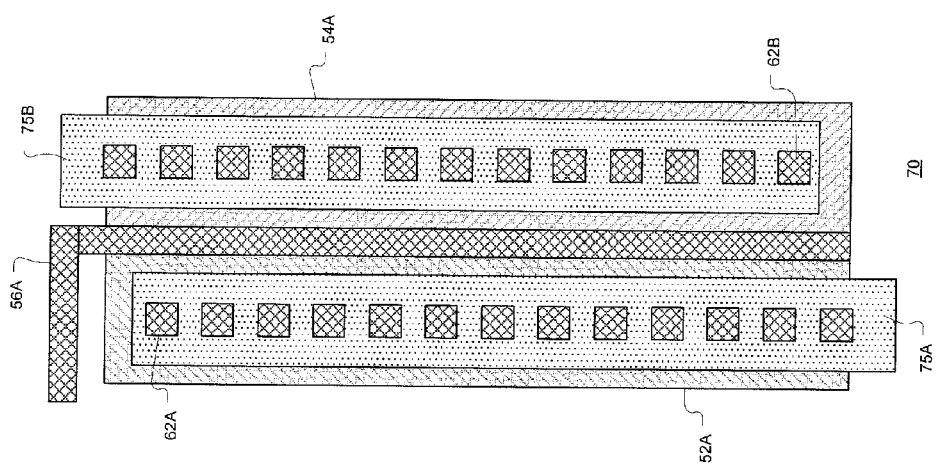
FIG. 3A is a block diagram of a semiconductor circuit or module with a first metallization, finger, or electrode pattern according to various embodiments.

Other metallization configurations that may reduce the effect of electromigration and potential parasitic capacitance are shown in FIGS. 3A to 7B. A transistor 70 with a first, lower and a second, upper metallization, finger, or electrode 75A, 75B, 75C, 75D is shown in FIGS. 3A-3B. As shown in FIG. 3A, the first, lower metallization 75A may extend along a substantial section of submodule, channel, or cell (source in an embodiment) length and include a plurality of contact pads or vias 62A coupling the metallization, finger, electrode, or track 75A to submodule, channel, or cell (source in an embodiment) semiconductor channel (n-type or p-type) or other section, segment, or layer.

The other first, lower metallization 75B may extend along a substantial section of second submodule, channel, or cell (drain in an embodiment) 54A length and include a plurality of contact pads or vias 62B coupling the metallization, finger, electrode, or track 75B to second submodule, channel, or cell (drain in an embodiment) 54A semiconductor channel (n-type or p-type) or other section, segment, or layer. As shown in FIG. 3B the submodule, channel, or cell (source in an embodiment) 52A may include a second, upper metallization 75C overlapping the first, lower metallization 75A for at least half the length of the first metallization 75A. Similarly, second submodule, channel, or cell (drain in an embodiment) 54A may include a second, upper metallization 75D overlapping the first metallization 75B for at least half the length of the first metallization 75B.

The additional metallizations, fingers, or electrodes 75C and 75D may also include a plurality of contact pads or vias 62C, 62D coupling the metallization, finger, electrode, or track 75C, 75D to the first submodule, channel, or cell (source in an embodiment) 52A, second submodule, channel, or cell (drain in an embodiment) 54A semiconductor channel (n-type or p-type) or other section, segment, or layer. The additional metallizations 75C, 75D shorter length (less than the length of the first metallizations 75A, 75B) may help reduce parasitic capacitance between adjacent metallizations 75A, 75B, 56A, 75C, and 75D. The combination of the first, lower metallizations 75A, 75B and the second, upper metallizations 75C, 75D may help reduce the effects of electromigration.

Figure 4B:
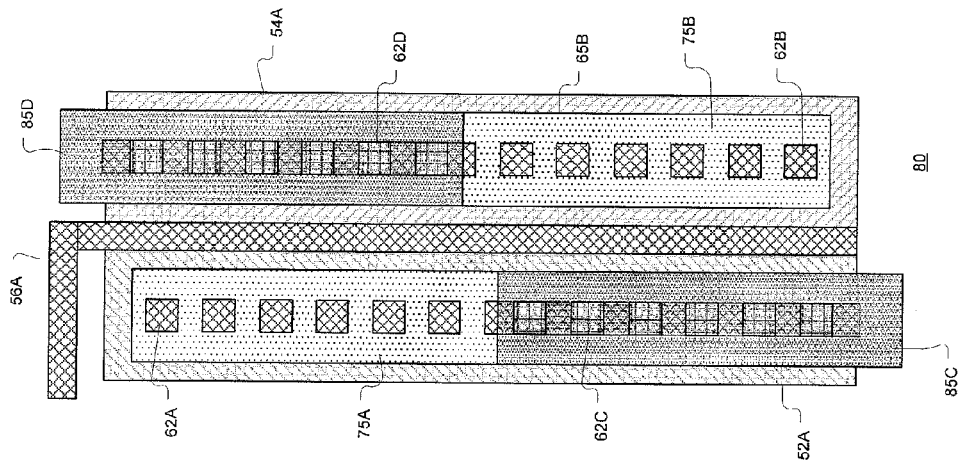
FIG. 4B is a block diagram of a semiconductor circuit or module with a first metallization, finger, or electrode pattern and additional metallization, finger, or electrode pattern according to various embodiments.
Figure 4A:
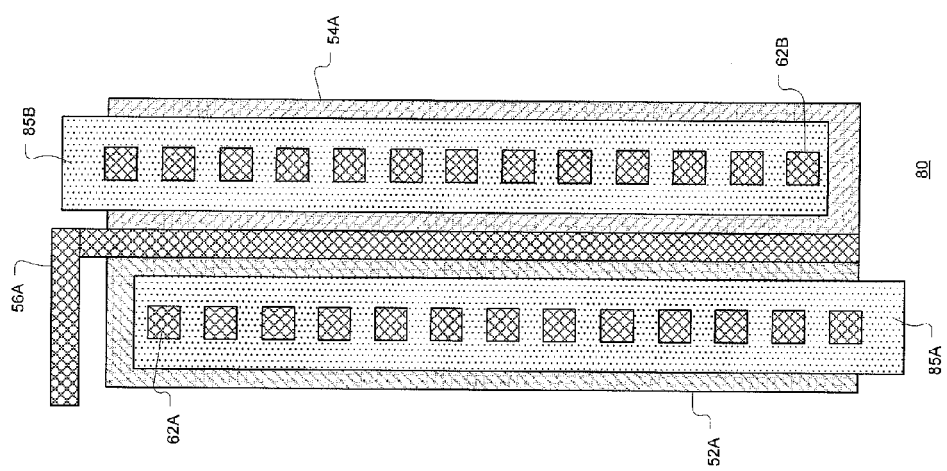
FIG. 4A is a block diagram of a semiconductor circuit or module with a first metallization, finger, or electrode pattern according to various embodiments.

FIGS. 4A and 4B are block diagrams of a semiconductor circuit or module 80 with a first, lower metallization, finger, or electrode 85A, 85B and a second, upper metallization, finger, or electrode 85C, 85D according to various embodiments. As shown in FIG. 4A, the first, lower metallization 85A may extend along a substantial section of submodule, channel, or cell (source in an embodiment) 52A length and include a plurality of contact pads or vias 62A coupling the metallization, finger, electrode, or track 85A to submodule, channel, or cell (source in an embodiment) 52A semiconductor channel (n-type or p-type) or other section, segment, or layer.

Similarly, the other first, lower metallization 85B may extend along a substantial section of second submodule, channel, or cell (drain in an embodiment) 54A length and include a plurality of contact pads or vias 62B coupling the metallization, finger, electrode, or track 85B to second submodule, channel, or cell (drain in an embodiment) 54A semiconductor channel (n-type or p-type) or other section, segment, or layer. As shown in FIG. 4B the submodule, channel, or cell (source in an embodiment) 52A may include a second, upper metallization 85C overlapping the first, lower metallization 85A for less than half the length of the first metallization 85A.

Similarly, second submodule, channel, or cell (drain in an embodiment) 54A may include a second, upper metallization 85D overlapping the first metallization 85B for less than half the length of the first, lower metallization 85B. The additional metallizations 85C and 85D may also include a plurality of contact pads or vias 62C, 62D coupling the second, upper metallization, finger, electrode, or track 85C, 85D to the first submodule, channel, or cell (source in an embodiment) 52A, second submodule, channel, or cell (drain in an embodiment) 54A semiconductor channel (n-type or p-type) or other section, segment, or layer. The second, upper metallizations 85C, 85D shorter length (less than half the length of the first, lower metallizations 85A, 85B) may reduce parasitic capacitance between adjacent metallizations 85A, 85B, 56A, 85C, and 85D. The combination of the first, lower metallizations 85A, 85B and the second, upper metallizations 85C, 85D may help reduce the effects of electromigration.

Figure 5B:
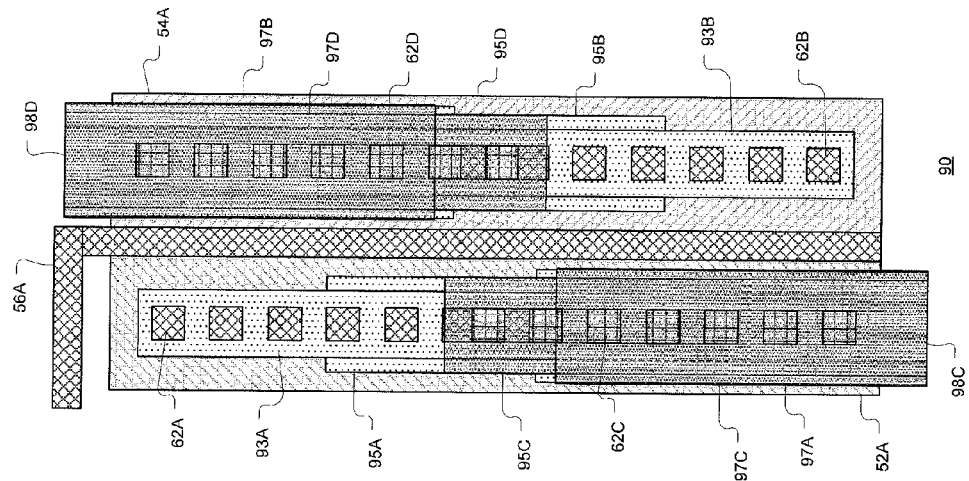
FIG. 5B is a block diagram of a semiconductor circuit or module with a first metallization, finger, or electrode pattern and additional metallization, finger, or electrode pattern according to various embodiments.
Figure 5A:
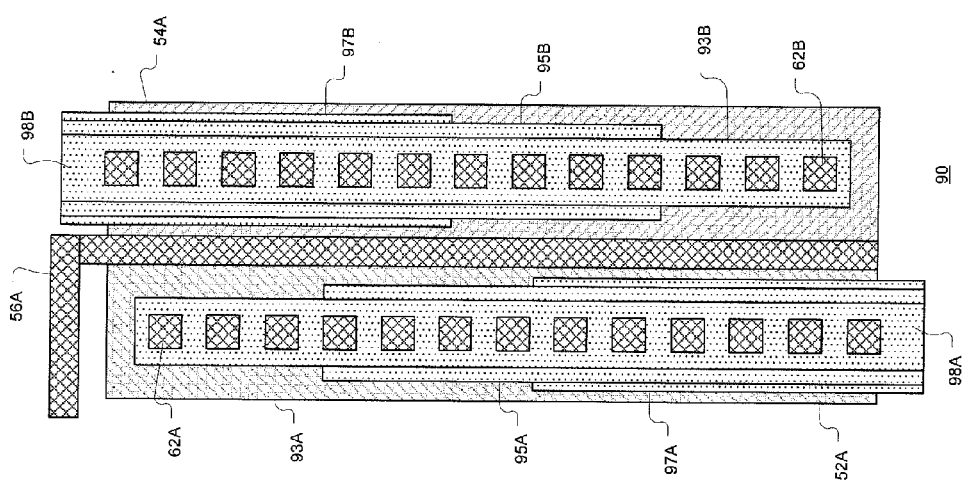
FIG. 5A is a block diagram of a semiconductor circuit or module with a first metallization, finger, or electrode pattern according to various embodiments.

FIGS. 5A and 5B are block diagrams of a semiconductor circuit or module 90 with a first, lower metallization or finger 98A, 98B and a second, upper metallization or finger 98C, 98D according to various embodiments. The first, lower metallizations or fingers 98A, 98B are similar to metallizations or fingers 58A, 58B shown in FIG. 2B with the addition of a third wide, proximal section 97A, 97B. In an embodiment the transistor 90 may only include the first metallizations 98A, 98B shown in FIG. 5A. The transistor 90 may include the first 98A, 98B and a second, upper metallization 98C, 98D as shown in FIG. 5B.

As shown in FIG. 5A, the first metallizations 98A, 98B may extend along a substantial section of submodule, channel, or cell 52A, 54A length and include three sections (97A, 95A, 93A), (97B, 95B, 93B), each more distal section more narrow in width than the previous section. As shown in FIG. 5B the submodule, channel, or cell 52A, 54A (source, drain in an embodiment) may include a second, upper metallization 98C, 98D overlapping the first, lower metallization 98A, 98B for less than the length of the first, lower metallization 98A, 98B. The second, upper metallization 98C, 98D may include a first wide, proximal section 97C, 97D and a narrower, more distal section 95C, 95D.

The second, upper metallizations 98C and 98D may also include a plurality of contact pads or vias 62C, 62D coupling the second, upper metallization, finger, electrode, or track 95C, 95D to the submodule, channel, or cell 52A, 54A (source, drain in an embodiment) semiconductor channel (n-type or p-type) or other section, segment, or layer. The second, upper metallizations 98C, 98D shorter length (less than the length of the first, lower metallizations 98A, 98B) may reduce parasitic capacitance between adjacent metallizations 98A, 98B, 56A, 98C, and 98D. The combination of the first, lower metallizations 98A, 98B and the second, upper metallizations 98C, 98D may help reduce the effects of electromigration.

Figure 6B:
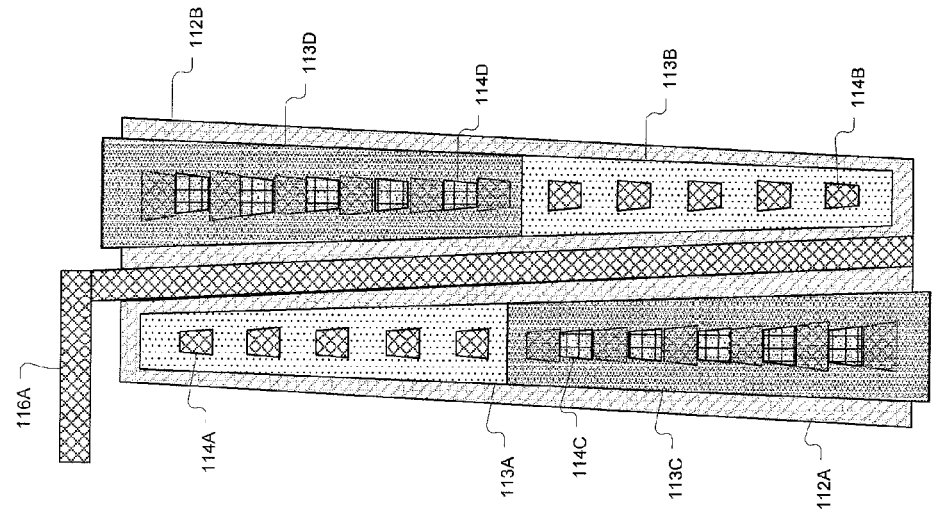
FIG. 6B is a block diagram of a semiconductor circuit or module with a first metallization, finger, or electrode pattern and additional metallization, finger, or electrode pattern according to various embodiments.
Figure 6A:
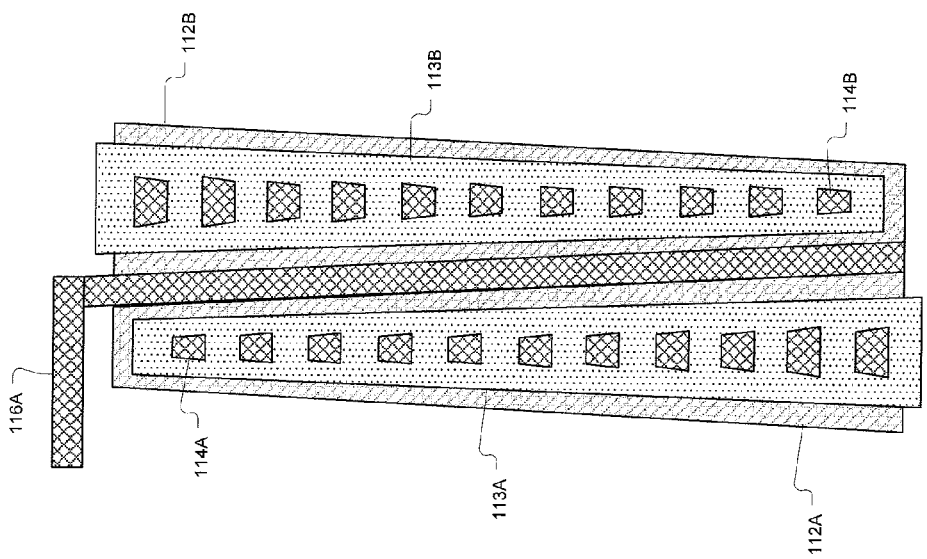
FIG. 6A is a block diagram of a semiconductor circuit or module with a first metallization, finger, or electrode pattern according to various embodiments.

FIGS. 6A and 6B are block diagrams of a semiconductor circuit or module 110 with a first, lower metallization or finger 113A, 113B and a second metallization or finger 113C, 113D according to various embodiments. In an embodiment the submodule, channel, or cell 112A, 112B (source, drain in an embodiment) cross sectional shape may be tapered from a proximal to distal end with the submodule, channel, or cell 112A, 112B proximal end opposite the other of submodule, channel, or cell 112A, 112B distal end. The submodule, channel, or cell 112A, 112B (source, drain in an embodiment) geometry may reduce the effect of electromigration and reduce parasitic capacitance between the submodules, channels, or cells (source, drain in an embodiment) 112A, 112B In an embodiment the semiconductor, module, or transistor 110 may only include first metallizations 113A, 113B as shown in FIG. 6A. The metallizations, fingers, or electrodes 113A and 113B may continuously taper from its proximal end to its distal end similar to the respective first submodule, channel, or cell 112A, 112B. The transistor 110 may include also include a second, upper metallization 113C, 113D as shown in FIG. 6B. As shown in FIG. 6A, the first, lower metallization 113A, 113B may extend along a substantial section of the submodule, channel, or cell (source, drain in an embodiment) 112A, 112B length and include a plurality of contact pads 114A, 114B coupling the metallization, finger, electrode, or track 113A, 113B to the submodule, channel, or cell (source, drain in an embodiment) 112A, 112B semiconductor channel (n-type or p-type) or other section, segment, or layer. In an embodiment the contact pads 114A, 114B may also be tapered in shape similar to the metallizations, fingers, electrodes, or tracks 113A, 113B and the submodule, channel, or cell (source, drain in an embodiment) 112A, 112B.

As shown in FIG. 6B a submodule, channel, or cell (source, drain in an embodiment) 112A, 112B may also include a second, upper metallization 113C, 113D overlapping a section of a first, lower metallization 113A, 113B for less than the length of the first, lower metallization 113A, 113B. The second, upper metallization 113C, 113D may be tapered similar to the first, lower metallization 113A, 113B. The second, upper metallizations 113C, 113D may also include a plurality of contact pads or vias 114C, 114D coupling the metallization, finger, electrode, or track 113C, 113D to a submodule, channel, or cell (source, drain in an embodiment) 112A, 112B semiconductor channel (n-type or p-type) or other section, segment, or layer.

In an embodiment the contact pads 114C, 114D may be tapered in shape similar to the metallizations, fingers, electrodes, or tracks 113C, 113D, and the submodule, channel, or cell (source, drain in an embodiment) 112A, 112B. The second, upper metallizations' 113C, 113D shorter length (less than the length of the first, lower metallizations 113A, 113B) and the submodule, channel, or cell (source, drain in an embodiment) 112A, 112B geometry may reduce parasitic capacitance between adjacent metallizations 113A, 113B, 116A, 113C, and 113D. The combination of the first, lower metallizations 113A, 113B and the second, upper metallizations 113C, 113D may help reduce the effects of electromigration due the additional metallization at the channels 112A, 112B proximal end where the current density may be greater.

FIGS. 7A and 7B are block diagrams of a semiconductor circuit or module 130 with first, lower metallizations or fingers 133A, 133B and second, upper metallizations or fingers 133C, 133D according to various embodiments. In an embodiment a submodule, channel, or cell (source, drain in an embodiment) 132A, 132B cross sectional shape may be rectangular from a proximal end to a distal end. In an embodiment the transistor 130 may only include first metallizations 133A, 133B shown in FIG. 7A. The metallization or fingers 133A and 133B may have a continuous taper from their proximal end to their distal end. The transistor 130 may include also second, upper metallizations or fingers 133C, 133D as shown in FIG. 7B.

As shown in FIG. 7A, the first, lower metallizations or fingers 133A, 133B may extend along a substantial section of a submodule, channel, or cell (source, drain in an embodiment) 132A, 132B length and include a plurality of contact pads 134A, 134B coupling the metallizations, fingers, electrodes, or tracks 133A, 133B to a submodule, channel, or cell (source, drain in an embodiment) 132A, 132B semiconductor channel (n-type or p-type) or other section, segment, or layer. In an embodiment the contact pads 134A, 134B may be tapered in shape similar to the metallizations, fingers, electrodes, or tracks 133A, 133B.

As shown in FIG. 7B a submodule, channel, or cell (source, drain in an embodiment) 132A, 132B may also include second, upper metallizations or fingers 133C, 133D overlapping a section of the first, lower metallizations or fingers 133A, 133B for less than the length of the first metallizations or fingers 133A, 133B. The second, upper metallizations 133C, 133D may be tapered similar to the first, lower metallizations 133A, 133B. The second, upper metallizations 133C, 133D may include a plurality of contact pads or vias 134C, 134D coupling the metallization, finger, electrode, or track 133C, 133D to the submodule, channel, or cell (source, drain in an embodiment) 132A, 132B semiconductor channel (n-type or p-type) or other section, segment, or layer. In an embodiment the contact pads 134C, 134D may be tapered in shape similar to the metallizations, fingers, electrodes, or tracks 133C, 133D. The second, upper metallizations 133C, 133D shorter length (less than the length of the first metallizations 133A, 133B) and the metallizations 133A, 133B, 133C, 133D tapered geometry may reduce parasitic capacitance between adjacent metallizations 133A, 133B, 136A, 133C, and 133D. The combination of the first, lower metallizations 133A, 133B and the second, upper metallizations 133C, 133D may help reduce the effects of electromigration due the additional metallization at the channels 132A, 132B proximal ends where the current density may be greater.

Figure 8:
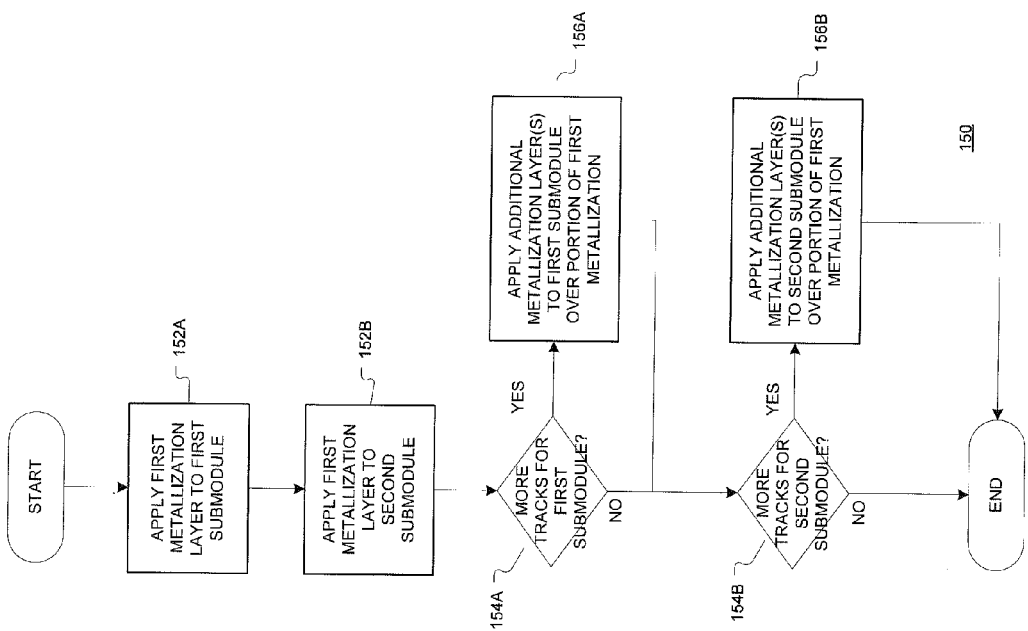
FIG. 8 is a flow diagram illustrating several methods according to various embodiments.

FIG. 8 is a flow diagram illustrating several methods 150 according to various embodiments. The method 150 may be employed to apply one or more metallizations 58A-D, 75A-B, 85A-D, 98A-D, 113A-D, 133A-D to one or more submodules 52A-B, 54A-B, 112A-B, 132A-B of a transistor or module 50, 60, 70, 80, 90, 110, or 130. The method 150 may apply a first metallizations layer 58A-B, 75A-B, 85A-B, 98A-B, 113A-B, 133A-B to a first submodule 52A-B, 54A-B, 112A-B, 132A-B including contact pads 62A-D, 114A-D, 134A-D such as shown in FIGS. 2B to 7B (activity 152A). The method 150 may apply a first, lower metallization, finger, or electrode 58A-B, 75A-B, 85A-B, 98A-B, 113A-B, 133A-B to a second submodule 52A-B, 54A-B, 112A-B, 132A-B including contact pads 62A-D, 114A-D, 134A-D such as shown in FIGS. 2B to 7B (activity 152B).

The method 150 may apply a second or additional, upper metallizations, fingers, electrodes, or tracks 58C-D, 75C-D, 85C-D, 113C-D, 133C-D to a submodule 52A-B, 54A-B, 112A-B, 132A-B including contact pads 62A-D, 114A-D, 134A-D such as shown in FIGS. 2B to 7B (activity 156A) when the module 50 submodule, channel, or cell includes multiple metallizations (activity 154A). The method 150 may apply a second or additional, upper metallization layers 58C-D, 75C-B, 85C-D, 113C-D, 133C-D to another submodule 52A-B, 54A-B, 98A-D, 56A-B, 112A-B, 132A-B including contact pads 62A-D, 114A-D, 134A-D such as shown in FIGS. 2B to 7B (activity 156B) when the module 50 another submodule, channel, or cell includes multiple metallizations (activity 154B).

In an embodiment the metallizations, fingers, electrodes, or tracks 58A-D, 75A-B, 85A-D, 98A-D, 113A-D, 133A-D may have a width from 0.2 microns to 2.0 microns and vary about 1.0 microns from proximal to distal end in another embodiment. The submodules, channels, or cells (source or drain in an embodiment) 52A-B, 54A-B, 112A-B, 132A-B may have a width from 0.2 microns to 2.0 microns and vary about 1.0 microns from proximal to distal end in another embodiment. The contact pads 62A-D, 114A-D, 134A-D may have a width from 0.1 microns to 1.5 microns and vary about 0.4 microns from proximal to distal end in another embodiment.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure set forth below is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A semiconductor device, including:
    a first channel having a length, the first channel tapered along its length;
    a second channel having a length;
    a third channel between and adjacent to the first and second channels;
    a first metallization on the first channel, the first metallization having a length, a proximal end, and a distal end, the first metallization length greater than half the length of the first channel and the first metallization distal end width less than its proximal end width; and
    a second metallization on the second channel, the second metallization having a length, a proximal end, and a distal end, the second metallization length greater than half the length of the second channel and the second metallization distal end width less than its proximal end width.

2. The semiconductor device of claim 1, wherein the semiconductor device is a FET, the first channel is one of a source and drain, the second channel is the other of a drain and source, and the third channel is a gate.

3. The semiconductor device of claim 1, wherein the first metallization is tapered along its length.

4. The semiconductor device of claim 3, wherein the second metallization is tapered along its length.

5. The semiconductor device of claim 1, further comprising a third metallization overlaying a portion of the first metallization, the third metallization having a length, a proximal end, and a distal end, wherein the third metallization length is less than the length of the first metallization and the third metallization distal end width is less than its proximal end width.

6. The semiconductor device of claim 1, wherein the second channel is tapered along its length.

7. The semiconductor device comprising:
    a first channel having a length;
    a second channel having a length;

a third channel between and adjacent to the first and second channels;
a first metallization on the first channel, the first metallization having a length, a proximal end, and a distal end, the first metallization length greater than half the length of the first channel and the first metallization distal end width less than its proximal end width;
a second metallization on the second channel, the second metallization having a length, a proximal end, and a distal end, the second metallization length greater than half the length of the second channel and the second metallization distal end width less than its proximal end width; and
a third metallization overlaying a portion of the first metallization, the third metallization having a length, a proximal end, and a distal end, the third metallization length is less than the length of the first metallization and the third metallization distal end width is less than its proximal end width.

8. The semiconductor device of claim 7, further comprising a fourth metallization overlaying a portion of the second metallization, the fourth metallization having a length, a proximal end, and a distal end, the fourth metallization length is less than the length of the second metallization and the fourth metallization distal end width is less than its proximal end width.

9. A semiconductor device, including:
a first channel having a length;
a second channel having a length;
a third channel between and adjacent to the first and second channels;
a first metallization on the first channel, the first metallization having a length, a proximal end, and a distal end, the first metallization length greater than half the length of the first channel;
a second metallization on the second channel, the second metallization having a length, a proximal end, and a distal end, the second metallization length greater than half the length of the second channel;
a third metallization overlaying a portion of the first metallization, the third metallization having a length, a proximal end, and a distal end, the third metallization length less than the length of the first metallization; and
a fourth metallization overlaying a portion of the second metallization, the fourth metallization having a length, a proximal end, and a distal end, the fourth metallization length less than the length of the second metallization.

10. The semiconductor device of claim 9, wherein the first metallization distal end width is less than its proximal end width and the second metallization distal end width is less than its proximal end width.

11. The semiconductor device of claim 10, wherein the third metallization distal end width is less than its proximal end width and the fourth metallization distal end width is less than its proximal end width.

12. The semiconductor device of claim 9, wherein the semiconductor device is a FET, the first channel is one of a source and drain, the second channel is the other of a drain and source, and the third channel is a gate.

13. The semiconductor device of claim 12, wherein the first metallization and the third metallization are tapered along their length.

14. The semiconductor device of claim 13, wherein the second metallization and the fourth metallization are tapered along their length.

15. The semiconductor device of claim 14, wherein the first channel and the second channel are tapered along their length.

16. The semiconductor device of claim 5, further comprising a fourth metallization overlaying a portion of the second metallization, the fourth metallization having a length, proximal end, and distal end, the fourth metallization length is less than the length of the second metallization and the fourth metallization distal end width is less than its proximal end width.

17. A field effect transistor (FET) structure, including:
a source region, the source region tapered along its length;
a drain region;
a source metallization, the source metallization having a length, a proximal end, and a distal end, the source metallization length greater than half the length of the source region and the source metallization distal end width less than its proximal end width; and
a drain metallization, the drain metallization having a length, a proximal end, and a distal end, the drain metallization length greater than half the length of the drain region and the drain metallization distal end width less than its proximal end width.

18. The FET structure of claim 17, wherein the source metallization is tapered along its length.

19. The FET structure of claim 18, wherein the drain metallization is tapered along its length.

20. The FET structure of claim 17, wherein the drain region is tapered along its length.

21. The FET structure of claim 17, further comprising a second source metallization overlaying a portion of the source metallization, the second source metallization having a length, a proximal end, and a distal end, the second source metallization length is less than the length of the source metallization and the second source metallization distal end width is less than its proximal end width.

22. The FET structure of claim 21, further comprising a second drain metallization overlaying a portion of the drain metallization, the second drain metallization having a length, a proximal end, and a distal end, the second drain metallization length less than the length of the drain metallization and the second drain metallization distal end width is less than its proximal end width.

* * * * *